(12) United States Patent
Chou

(10) Patent No.: US 6,853,579 B1
(45) Date of Patent: Feb. 8, 2005

(54) NON-REFRESH FOUR-TRANSISTOR MEMORY CELL

(75) Inventor: Chung-Cheng Chou, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/658,845

(22) Filed: Sep. 9, 2003

(51) Int. Cl.$^7$ .................................... G11C 11/00
(52) U.S. Cl. .................... 365/154; 365/156; 365/191; 365/225
(58) Field of Search ........................... 365/154, 156, 365/191, 225, 226

(56) References Cited

U.S. PATENT DOCUMENTS 5,640,342 A * 6/1997 Gonzalez .................... 365/156
6,005,796 A * 12/1999 Sywyk et al. ............... 365/156

* cited by examiner

Primary Examiner—Richard Elms
Assistant Examiner—Pho M. Luu
(74) Attorney, Agent, or Firm—Thomas, Kayden, Horstemeyer, & Risley

(57) ABSTRACT

An exemplary four-transistor random access memory cell includes a first transistor of a first conductivity type having a gate coupled to a word line and a source coupled to a bit line, a second transistor of the first conductivity type having a gate coupled to a drain of the first transistor and a source coupled to receive a first voltage, a third transistor of a second conductivity type having a source coupled to a drain of the second transistor, a source coupled to receive a second voltage and a drain coupled to the drain of the first transistor, and a fourth transistor of the second type having a gate coupled to the drain of the first transistor, a source coupled to receive the second voltage and a drain coupled to the drain of the second transistor.

46 Claims, 5 Drawing Sheets

NON-REFRESH FOUR-TRANSISTOR MEMORY CELL

BACKGROUND

The present invention relates to a memory cell and particularly to a non-refresh 4T (Four-Transistor) memory cell.

To meet customer demand for smaller and more powerful, efficient integrated circuits (ICs), manufacturers are designing newer ICs that operate with lower supply voltages and include smaller internal sub-circuits such as memory cells. Many ICs, such as memory circuits or other circuits such as microprocessors having onboard memory, include one or more SRAM cells for data storage. SRAM cells are popular because they operate at a higher speed than dynamic-random-access-memory (DRAM) cells. Further as long as SRAM cells are powered, they can store data indefinitely, unlike DRAM cells, which must be periodically refreshed.

FIG. 1 is a circuit diagram of a conventional 6-transistor (6-T) SRAM cell 110, which can operate at a relatively low supply voltage, for example 2.2V–3.3V, but which is relatively large in size. A pair of NMOS access transistors 112 and 114 allow complementary bit values D and $\overline{D}$ on digit lines 116 and 118, respectively, to be read from and to be written to a storage circuit 120 of the cell 110. The storage circuit 120 includes NMOS pull-down transistors 122 and 126, which are coupled in a positive-feedback configuration with PMOS pull-up transistors 124 and 128. Nodes A and B are the complementary inputs/outputs of the storage circuit 120, and the respective complementary logic values at these nodes represent the state of the cell 110. For example, when the node A is at logic 1 and the node B is at logic 0, logic 1 is stored in the cell 110. Conversely, when the node A is at logic 0 and the node B is at logic 1, then the cell 110 stores logic 0. Thus, the cell 110 is bi-stable, i.e., it can have one of two stable states, logic 1, or logic 0.

In operation during a read of the cell 110, a word-line WL, which is coupled to the gates of the transistors 112 and 114, is driven to a voltage approximately equal to Vcc to activate the transistors 112 and 114. For example, assume that Vcc=logic 1=5V and Vss=logic o=0V, and that at the beginning of the read, a logic 0 is stored in the cell 110, such that the voltage level at the node A is 0V and the voltage level at the node B is 5V. Also, assume that before the read cycle, the digit lines 116 and 118 are equilibrated at approximately Vcc. Therefore, the NMOS transistor 112 couples the node A to the digit line 116, and the NMOS transistor 114 couples the node B to the digit line 118. For example, assuming that the threshold voltages of the transistors 112 and 114 are both 1V, then the transistor 114 couples a maximum of 4V from the digit line 118 to the node B. The transistor 112, however, couples the digit line 116 to the node A, which pulls down the voltage on the digit line 116 enough (for example, 100–500 millivolts) to cause a sense amp (not shown) coupled to the lines 16 and 18 to read the cell 110 as storing a logic 0.

During a write operation, for example, of logic 1 to the cell 110, and making the same assumptions as discussed above for the read, the transistors 112 and 114 are activated as discussed above, and logic 1 is driven onto the digit line 116 and logic 0 is driven onto the digit line 118. Thus, the transistor 112 couples 4V (the 5V on the digit line 116 minus the 1V threshold of the transistor 112) to the node A, and the transistor 114 couples 0V from the digit line 118 to the node B. The low voltage on the node B turns off the NMOS transistor 126, and turns on the PMOS transistor 128. Thus, the inactive NMOS transistor 126 allows the PMOS transistor 128 to pull the node A up to 5V. This high voltage on the node A turns on the NMOS transistor 122 and turns off the PMOS transistor 124, thus allowing the NMOS transistor 122 to reinforce the logic 0 on the node B. Likewise, if the voltage written to the node B is 4V and that written to the node A is 0V, the positive-feedback configuration ensures that the cell 110 will store logic 0.

Because the PMOS transistors 126 and 128 have low on resistances (typically on the order of a few kilohms), they can often pull the respective nodes A and B virtually all the way up to Vcc in less than 10 nanoseconds (ns), and thus render the cell 110 relatively stable and allow the cell 110 to operate at a low supply voltage as discussed above. But unfortunately, the transistors 126 and 128 cause the cell 110 to be approximately 30%–40% larger than a 4-transistor (4-T) SRAM cell, which is discussed next.

FIG. 2 is a circuit diagram of a conventional 4-T SRAM cell. The cell has a cross coupled inverter. Each inverter includes a pull-down transistor T1 or T2 and a load p1 or p2, and a pair of transfer transistors T3, T4. The gate electrode of T1 is connected to the drain of T2 and the gate electrode of T2 is connected to the drain of T1 to provide a flip-flop operation. The load device p1, p2 may be depletion or enhancement transistor or a high value resistor. The load devices p1 and p2 are connected to the power supply $V_{dd}$ on one side and to the drain of drive transistors T1, T2 respectively. The purpose of the resistor load p1, p2 and the power supply $V_{dd}$ is to counteract the effect of charge leakage at the drains of the drive and transfer transistors (nodes N1 and N2). The gates of the transfer transistors T3, T4 are connected to a WORD line 28 and are switched ON by asserting the WORD line 28. The drain/source contacts of the transfer transistors are connected between the nodes N1, N2, and BIT lines 25, 26 respectively.

The operation of a SRAM is well known. In brief, the charge (voltage) in nodes N1 and N2 represent the logic state of the cell. For example, to write a data of "1" in node N1, the bit line 25 is pre-charged to a desired voltage and the word line 28 is asserted. Node N1 is charged up and drives N2 to a "no charge" or a low state. To read the cell, bit lines 25 and 26 are pre-charged and word line 28 is asserted. The bit line 26 is discharged through transistors T4 and T2 and the transient charge is sensed by sense amplifier-external to the cell.

A four transistor (4T) SRAM uses a high value resistor a its load device. The 4T SRAM is attractive as it has the potential for reduced cell size compared to a 6T SRAM wherein the load devices are transistors. The primary function of the load resistor is to supply enough current to compensate for the junction leakage and maintain the charge in the node. Junction leakage currents typically range from femto-ampere to pico-ampere ($10^{-15}$ to $10^{-12}$ A) for FETs fabricated under contamination free conditions, which is the minimum current required from the loaded (p1, p2) power supply $V_{dd}$. The maximum resistor value acceptable is in the range of $10^2$ to $10^{15}$ ohms, assuming a $V_{dd}$ of 3 to 5 volts. The value of the resistor, in turn is affected by the availability of material that has a very high intrinsic resistance and the cell area available for resistor layout. In addition, the resistor material and process should be compatible with silicon manufacturing.

However, for on-chip storage in microprocessors and other logic circuits, the 4T-SRAMs have not been used. This is due to a complex process necessary to form a load element and thus, the 4T-SRAMs have poor stability at low voltage. In the quarter-micrometer generation and later, only 6T-SRAM cells have been reported as being used for advanced technologies to reduce the cell size, such as borderless contact, self-aligned contact, and local-interconnect.

A loadless 4T-SRAM cell is proposed by Kenji Noda et al., in the article entitled "A Loadless CMOS Four-Transistor SRAM Cell in a 0.18-$\mu$m Logic Technology" in IEEE Transactions on Electron Devices, Vol. 48, No. 12, December 2001, pp. 2851–2855. FIG. 3 shows an example of a circuit of the loadless 4T-SRAM cell. The single cell comprises two nMOSFETs 311 and 312 for drive transistors and two pMOSFETs 321 and 322 for transfer transistors. Compared with the conventional 4T-SRAM having nMOS-FETs and load elements, an advantage of using pMOSFETs is that the high-node level rises immediately after a read or write operation. During a stand-by cycle, bit lines are pre-charged at the $V_{dd}$. At this point, the pMOS transfer transistors 321 and 322, which are turned off, work as load elements. In order to retain the data without a refresh cycle, an off-state current of the pMOSPET- has to be higher than that of the nMOSFET-, even when the source-drain bias for the nMOSFET is approximately 1.8 V and that for the pMOSFET is less than 0.1 V. The pMOSFET is the same as a nominal transistor in logic circuits, but the nMOSFET is given 0.25 V higher threshold voltages. The off-state current for nMOSFET at V in the saturated region is lower than that for the pMOSFET at V in a linear region by two orders of magnitude. For these MOSFETs, junction leakage current and band-to-band tunneling current are negligible when the gate bias is 0V. With sufficient margin for the difference between the nMOSFET and the pMOSFET, the high-node level cannot be retained with either a load element or a specialized circuit, at least for a single cell. In read/write operations, cell nodes have full swing signals. The maximum bit-line swings in the read cycles are approximately 1.1 V, which is sufficient for high-speed and stable read operation. When reading the cell data, the pMOS transfer gate connected to the low-node operates as a source-follower circuit.

Accordingly, the previous loadless 4T-SRAM cells are deficient in that a data signal cannot be stably sustained in cell capacitor due to several leakage paths, such as gate oxide direct tunneling, channel leakage, and junction leakage so that frequent data refreshing is necessary when the cell signals go beyond the sensing margin.

SUMMARY OF THE INVENTION

The object of the present invention is to provide a loadless and refresh-free 4T-SRAM cell with a small cell size and larger sensing margin.

To achieve the foregoing and other objects, the invention is directed to novel systems and methods for overcoming conventional 4T-SRAM cells. In one embodiment of the system, among others, can be implemented to include a four-transistor random access memory cell. This embodiment includes a first transistor of a first conductivity type having a gate coupled to a word line and a source coupled to a bit line, a second transistor of the first conductivity type having a gate coupled to a drain of the first transistor and a source coupled to receive a first voltage, a third transistor of a second conductivity type having a gate coupled to a drain of the second transistor, a source coupled to receive a second voltage and a drain coupled to the drain of the first transistor, and a fourth transistor of the second type having a gate coupled to the drain of the first transistor, a source coupled to receive the second voltage and a drain coupled to the drain of the second transistor.

Another embodiment of the invention provides a random access memory cell. This embodiment includes a first transistor of a first conductivity type having a gate coupled to a word line and a source coupled to a bit line, a second transistor of a second conductivity type having a source coupled to receive a second voltage and a drain coupled to the drain of the first transistor, a diode having an anode coupled to the drain of the first transistor and a cathode coupled to receive a first voltage, and an inverter having an input terminal coupled to the drain of the first transistor and an output terminal coupled to a gate of the second transistor.

Yet another embodiment of the invention includes a first memory device having a plurality of memory cells wherein data is read from and written into each of the memory cells through bit lines by control signals on word lines. Each of the memory cells includes a first transistor of a first conductivity type having a gate coupled to one of the word lines and a source coupled to one of the bit lines, a second transistor of the first conductivity type having a gate coupled to a drain of the first transistor and a source coupled to receive a first voltage, a third transistor of a second conductivity type having a gate coupled to a drain of the second transistor, a source coupled to receive a second voltage and a drain coupled to the drain of the first transistor, and a fourth transistor of the second type having a gate coupled to the drain of the first transistor, a source coupled to receive the second voltage and a drain coupled to the drain of the second transistor.

Still another embodiment of the invention includes a second memory device having a plurality of memory cells wherein data is read from and written into each of the memory cells through bit lines by control signals on word lines. Each of the memory cells includes a first transistor of a first conductivity type having a gate coupled to a word line and a source coupled to a bit line, a second transistor of a second conductivity type having a source coupled to receive a second voltage and a drain coupled to the drain of the first transistor, a diode having an anode coupled to the drain of the first transistor and a cathode coupled to receive a first voltage, and an inverter having an input terminal coupled to the drain of the first transistor and an output terminal coupled to a gate of the second transistor.

Another embodiment of the invention includes a 4T-SRAM cell in an SRAM array having pairs of first and second bit lines, and a first and second word line. The 4T-SRAM cell includes a first transistor of first conductivity type having a gate coupled to a first word line and a source coupled to a first bit line, a second transistor of the first conductivity type having a gate coupled to a drain of the first transistor and a source coupled to receive a first voltage, a third transistor of a second conductivity type having a gate coupled to a drain of the second transistor, a source coupled to receive a second voltage and a drain coupled to the drain of the first transistor, and a fourth transistor of the second conductivity type having a gate coupled to one of the second word lines, a source coupled to one of the second bit lines and a drain coupled to the gate of the third transistor.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Disclosed herein are novel systems and methods for non-refresh four-transistor memory cells. To facilitate description of the inventive system, an example system that can be used to implement non-refresh four-transistor memory cells is discussed with reference to the Figures. Although this system is described in detail, it will be appreciated that this system is provided for purposes of illustration only and that various modifications are feasible without departing from the inventive concept. After the example system has been described, an example of operation of the system will be provided to explain the manner in which the system can be used to provide non-refresh four-transistor memory cells.

Figure 1:
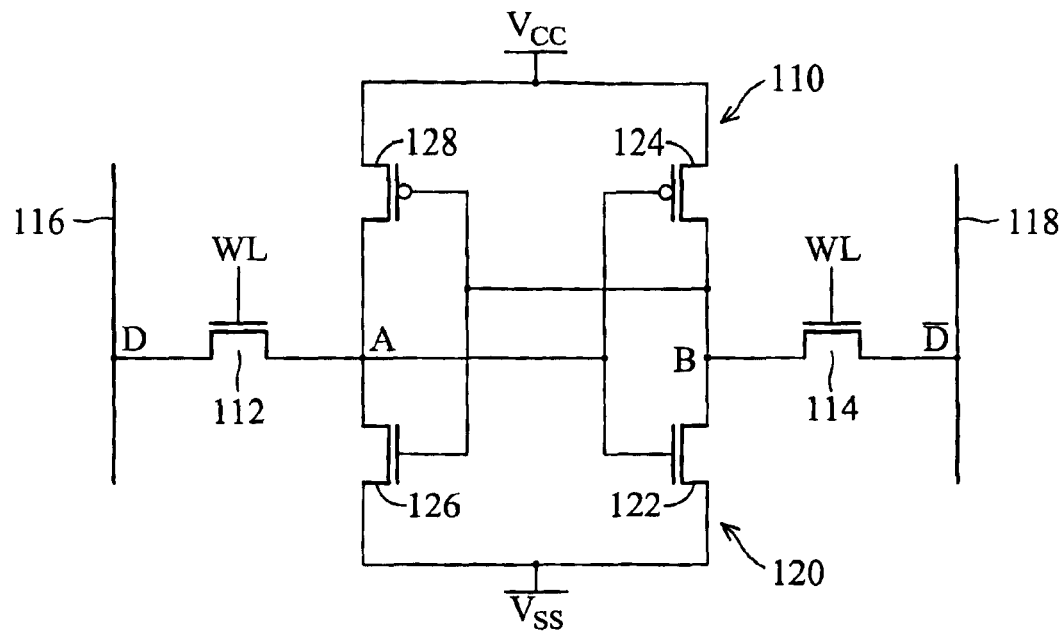
FIG. 1 is a circuit diagram of a conventional 6-transistor (6-T) SRAM cell.
Figure 2:
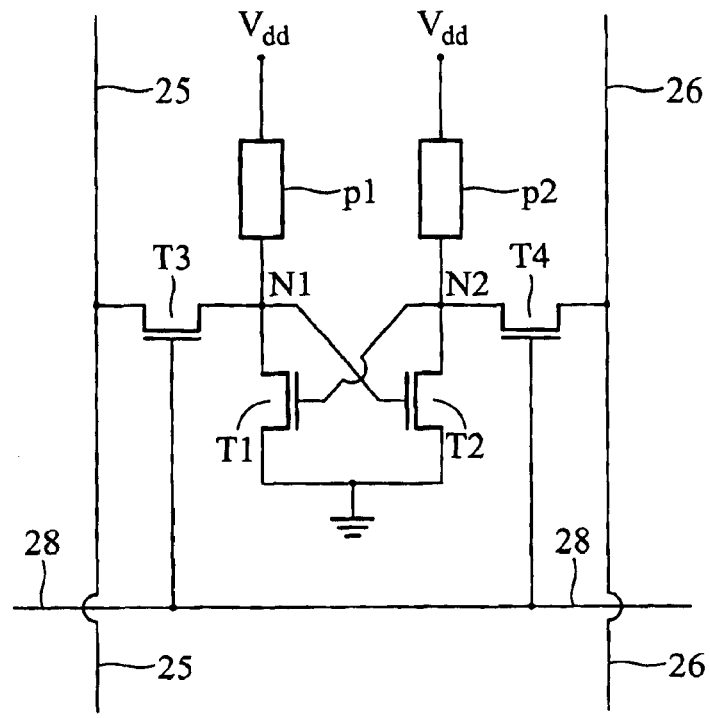
FIG. 2 is a circuit diagram of a conventional 4-T SRAM cell.
Figure 3:
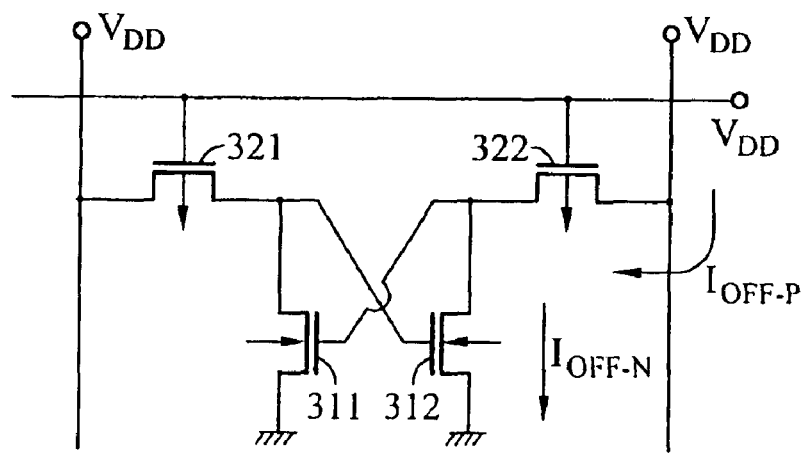
FIG. 3 shows a circuit of a conventional loadless 4T-SRAM cell.
Figure 4:
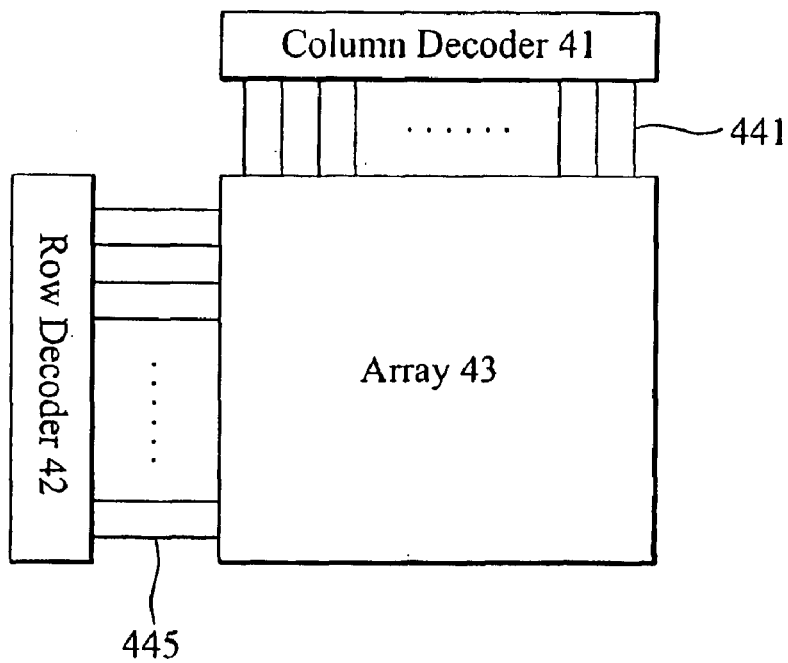
FIG. 4 is a block diagram depicting a memory device according to a preferred embodiment of the invention.

Referring now in more detail to the drawings, FIG. 4 is a block diagram showing a memory device according to a preferred embodiment of the invention. A memory device includes an array 43 composed of rows and columns of memory cells, a column decoder 41 coupled to the memory cells in the array 43 through bit lines 441 and a row decoder 42 coupled to the memory cells in the array 43 through word lines 445. The row decoder 42 may select a word line 445 in the array 43 when a write, read or refresh is performed. The row decoder 42 receives an address and row enable signal. When the row enable signal is asserted, the row decoder 42 can activate a word line 445 corresponding to the received address. The column decoder 41 may select a bit line 441 when a write or read is performed. The column decoder 41 receives an address and column enable signal. When the column enable signal is asserted, the column decoder 41 can select a bit line 441 corresponding to the received address.

Figure 5:
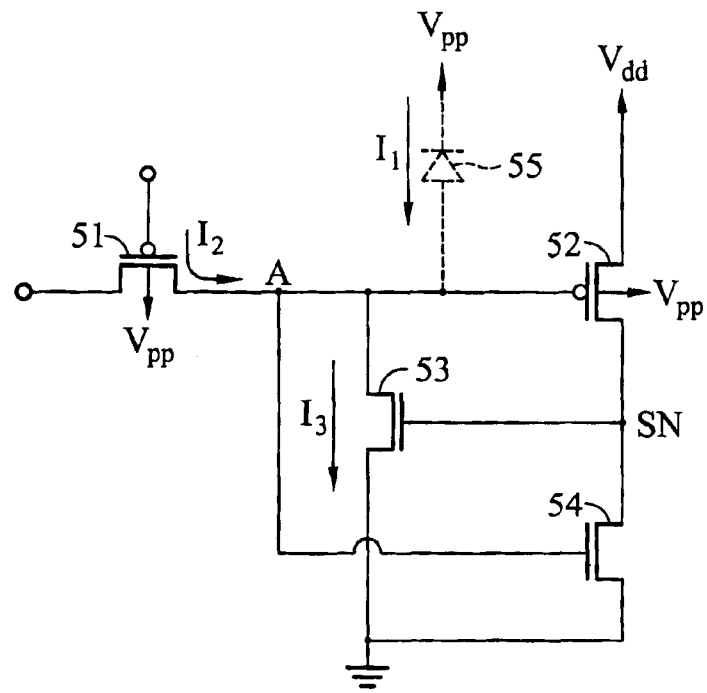
FIG. 5 is a circuit diagram depicting a 4T-RAM cell according to a first preferred embodiment of the invention.

FIG. 5 shows a circuit diagram of one memory cell in the array 43 according to a first preferred embodiment of the invention. The memory cell includes four transistors 51, 52, 53 and 54. The transistor 51 is a pMOS transistor having a gate coupled to a word line 445 (shown in FIG. 4) and a source coupled to a bit line 441 (shown in FIG. 4). The transistor 51 is preferably a transfer gate. The transistor 52 is a pMOS transistor with a gate coupled to a drain of the pMOS transistor 51 and a source coupled to receive a voltage $V_{dd}$. The transistor 53 is preferably an nMos transistor having a gate coupled to a drain of the PMOS transistor 52, a source coupled to receive a voltage $V_{ss}$ (ground) and a drain coupled to the drain of the pMOS transistor 51. The transistor 54 is preferably an nMos transistor having a gate coupled to the drain of the PMOS transistor 51, a source coupled to receive the voltage $V_{ss}$ and a drain coupled to the drain of the pMOS transistor 52.

It should be noted that each of the PMOS transistors 51 and 52 further includes a bulk coupled to receive a voltage $V_{PP}$ higher than $V_{dd}$. Thus, a parasitic diode 55 is formed between the junction of the bulk (N well) and drain (P+doping region) of the PMOS transistor 51.

In a preferred embodiment, the pMOS transistor 51 functions as an isolator to control the writing and reading of the data. For the write operation, when a data bit "" is asserted on the bit line 441 and the pMOS transistor 51 is turned on by the signal on the word line 445, a low voltage level appears on the node A, which turns on the PMOS transistor 52 and turns off the nMOS transistor 54. This pulls up the voltage on the storage node SN to $V_{dd}$. The voltage on the storage node SN further turns on the NMOS transistor 53, which keeps the voltage on the node A at a logic low state. Thus, the data bit "0" is latched on the storage node SN. On the contrary, when a data bit "1" is asserted on the bit line 441 and the pMOS transistor 51 is turned on by the signal on the word line 445, a high voltage level appears on the node A, which turns off the PMOS transistor 52 and turns on the nMOS transistor 54. This pulls down the voltage on the storage node SN to $V_{ss}$. The voltage on the storage node SN further turns off the nMOS transistor 53, which keeps the voltage on the node A at a logic high state. Thus, the data bit "1" is latched on the storage node SN. Since the voltage on the node A has great impact on the latching of the data bit on the storage node SN, three possible leakage currents $I_1$, $I_2$ and $I_3$ on the node A must be considered. The holding of data bit "0" on the storage node SN is always successful because the leakage currents results from the low voltage on the node A are negligible. The leakage currents $I_1$, $I_2$, and $I_3$ are significant only when a high voltage appears on the node A for holding of the data bit "1". The leakage current $I_3$ adversely pull down the voltage on the node A while the leakage currents $I_1$, and $I_2$ help to keep it at a high level. Consequently, only by adapting the cell to the condition that the sum of the leakage currents $I_1$ and $I_2$ is larger than the leakage current $I_3$, the data bit "1" can be successfully held on the storage node SN without data refreshing.

Figure 6:
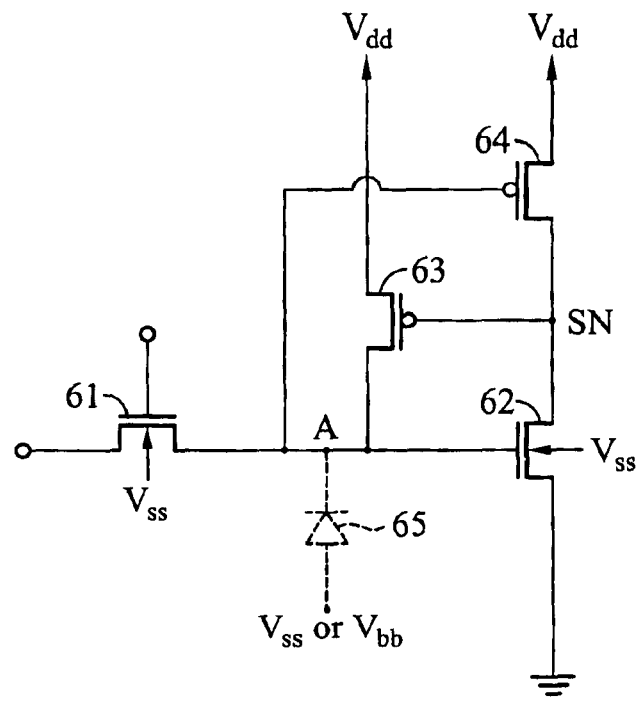
FIG. 6 is a circuit diagram depicting a 4T-RAM cell according to a second preferred embodiment of the invention.

FIG. 6 shows a circuit diagram of one memory cell in the array 43 according to a second preferred embodiment of the invention. This circuit is complementary to that shown in FIG. 5. The memory cell includes four transistors 61, 62, 63 and 64. The transistor 61 is an nMos transistor having a gate coupled to a word line 445 (shown in FIG. 4) and a source coupled to a bit line 441 (shown in FIG. 4). The transistor 61 is preferably a transfer gate. The transistor 62 is an nMos transistor with a gate coupled to a drain of the nMOS transistor 61 and a source coupled to receive a voltage $V_{ss}$ (ground). The transistor 63 is preferably a pMOS transistor having a gate coupled to a drain of the nMOS transistor 62, a source coupled to receive a voltage $V_{dd}$ and a drain coupled to the drain of the nMOS transistor 61. The transistor 64 is preferably a pMOS transistor having a gate coupled to the drain of the nMOS transistor 61, a source coupled to receive the voltage $V_{dd}$ and a drain coupled to the drain of the nMOS transistor 62.

Each of the nMOS transistors 61 and 62 further includes a bulk coupled to receive the voltage $V_{ss}$. Thus, a parasitic diode 65 is formed between the junction of the bulk (P well) and drain (N+doping region) of the nMOS transistor 61.

Figure 7:
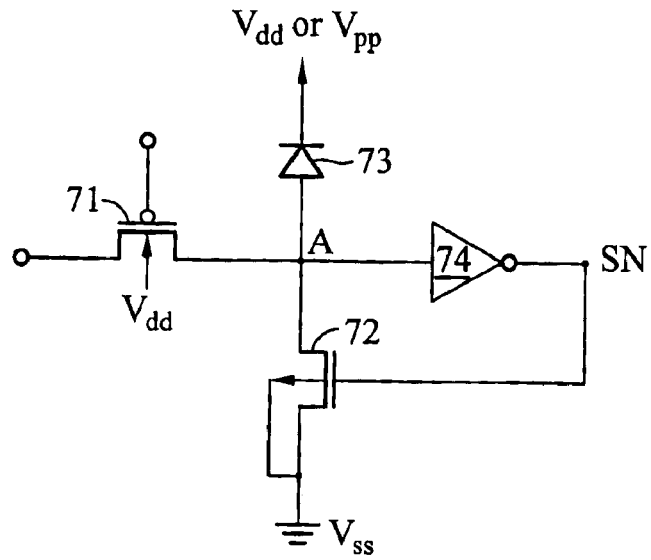
FIG. 7 is a circuit diagram depicting a RAM cell according to a third preferred embodiment of the invention.

FIG. 7 shows a circuit diagram depicting a RAM cell according to a third preferred embodiment of the invention.

In an example, the circuit shown in FIG. 7 is an equivalent circuit of the memory cell shown in FIG. 5. The RAM cell includes a pMOS transistor 71, an nMos transistor 72, a diode 73, and an inverter 74. The pMOS transistor 71 has a gate coupled to a word line 445 (shown in FIG. 4) and a source coupled to a bit line 441 (shown in FIG. 4). The nMOS transistor 72 has a source coupled to receive a voltage $V_{ss}$ (ground) and a drain coupled to the drain of the PMOS transistor 71. The diode 73 has an anode coupled to the drain of the pMOS transistor 71 and a cathode coupled to receive a voltage $V_{dd}$. The inverter 74 has an input terminal coupled to the drain of the pMOS transistor 71 and an output terminal coupled to a gate of the nMOS transistor 72. The diode 73 is the parasitic diode formed between the bulk and drain of the pMOS transistor 71 and the inverter 74 may be formed by the two complementary transistors 52 and 54 shown in FIG. 5.

Figure 8:
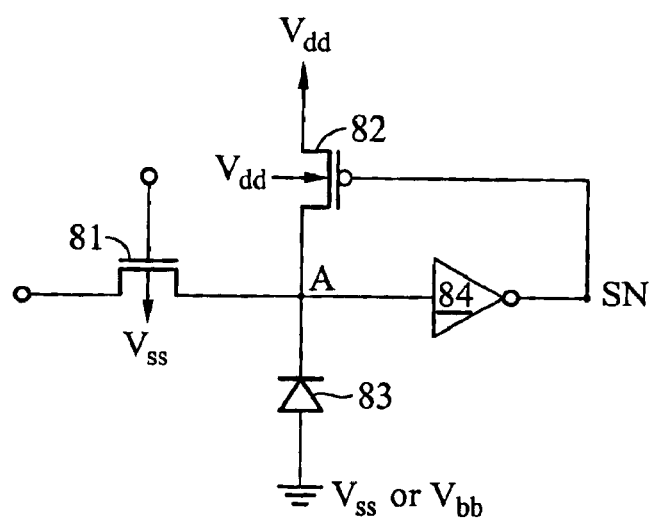
FIG. 8 is a circuit diagram depicting a RAM cell according to a fourth preferred embodiment of the invention.

FIG. 8 shows a circuit diagram depicting a RAM cell according to a fourth preferred embodiment of the invention. In an example, the circuit shown in FIG. 8 is an equivalent circuit of the memory cell shown in FIG. 6. The RAM cell includes an nMos transistor 81, a pMOS transistor 82, a diode 83, and an inverter 84. The nMOS transistor 81 has a gate coupled to a word line 445 and a source coupled to a bit line 441. The pMOS transistor 82 has a source coupled to receive a voltage $V_{dd}$ and a drain coupled to the drain of the nMOS transistor 81. The diode 83 has an anode coupled to the drain of the nMOS transistor 81 and a cathode coupled to receive a voltage $V_{ss}$ (ground). The inverter 84 has an input terminal coupled to the drain of the nMOS transistor 81 and an output terminal coupled to a gate of the pMOS transistor 82. The diode 83 is the parasitic diode formed between the bulk and drain of the nMOS transistor 81 and the inverter 84 may be formed by the two complementary transistors 62 and 64 shown in FIG. 6.

Figure 9:
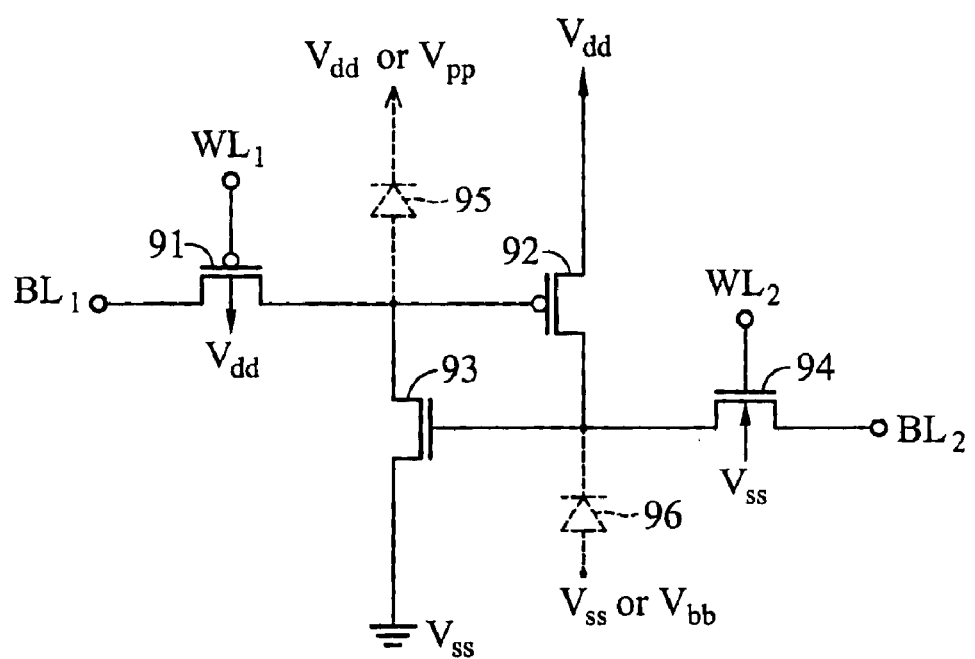
FIG. 9 is a circuit diagram depicting a 4T-SRAM cell according to a preferred embodiment of the invention.

FIG. 9 shows a circuit diagram of a memory cell implemented in SRAM form according to a preferred embodiment of the invention. The memory array of an SRAM includes pairs of bit lines $BL_1$ and $BL_2$, and word lines $WL_1$ and $WL_2$. The SRAM cell includes four transistors 91–94. The transistor 91 is preferably a pMOS transistor having a gate coupled to a word line $WL_1$ and a source coupled to a bit line $BL_1$. The transistor 92 is preferably a pMOS transistor with a gate coupled to the drain of the pMOS transistor 91 and a source coupled to receive a voltage $V_{dd}$. The transistor 93 is preferably an nMos transistor having a gate coupled to the drain of the PMOS transistor 92, a source coupled to receive a voltage $V_{ss}$ (ground) and a drain coupled to the drain of the pMOS transistor 91. The transistor 94 is preferably an nMos transistor with a gate coupled to a word line WL2, a source coupled to a bit line BL2 and a drain coupled to the gate of the nMOS transistor 93. The bulks of the pMOS transistor 91 and nMOS transistor 94 are respectively coupled to receive the voltage $V_{dd}$ and $V_{ss}$. Parasitic diodes 95 and 96 are respectively formed between the bulks and drains of the pMOS transistor 91 and nMOS transistor 94.

It should be noted that, in the previously described embodiments, the voltage $V_{dd}$ and $V_{ss}$ may be replaced with $v_{PP}$ and $V_{bb}$ respectively.

The preferred embodiments of the present invention provide a loadless and refresh-free 4T-SRAM cell with small cell size and larger sensing margin. In an example, the 4T-SRAM cell is constructed with an inverter, a pass gate and a pull down (or pull up for P type cell) transistor. The leakage current from $V_{dd}$ through the P/NW junction helps the cell to sustain data so that no refresh operation is needed.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A four-transistor random access memory cell comprising:

a first transistor of a first conductivity type having a gate coupled to a word line, source coupled to a bit line, and a bulk coupled to receive a third voltage;

a second transistor of the first conductivity type having a gate coupled to a drain of the first transistor and a source coupled to receive a first voltage;

a third transistor of a second conductivity type having a gate coupled to a drain of the second transistor, a source coupled to receive a second voltage and a drain coupled to the drain of the first transistor; and a fourth transistor of the second conductivity type having a gate coupled to the drain of the first transistor, a source coupled to receive the second voltage and a drain coupled to the drain of the second transistor.

2. The four-transistor random access memory cell as in claim 1, wherein the first voltage is $V_{dd}$, the second voltage is a ground voltage and the third voltage is $V_{PP}$ higher than $V_{dd}$.

3. The four-transistor random access memory cell as in claim 1, wherein the first voltage is $V_{dd}$, the second voltage is $V_{bb}$ and the third voltage is $V_{PP}$ higher than $V_{dd}$.

4. The four-transistor random access memory cell as in claim 1, wherein the second transistor further comprises a bulk coupled to receive a third voltage.

5. The four-transistor random access memory cell as in claim 4, wherein the first voltage is $V_{dd}$, the second voltage is a ground voltage and the third voltage is $V_{PP}$ higher than $V_{dd}$.

6. The four-transistor random access memory cell as in claim 4, wherein the first voltage is $V_{dd}$, the second voltage is $V_{bb}$ and the third voltage is $V_{PP}$ higher than $V_{dd}$.

7. The four-transistor random access memory cell as in claim 1, wherein the first transistor further comprises a bulk coupled to receive the first voltage.

8. The four-transistor random access memory cell as in claim 7, wherein the first voltage is $V_{dd}$ and the second voltage is a ground voltage.

9. The four-transistor random access memory cell as in claim 7, wherein the first voltage is $V_{dd}$ and the second voltage is $V_{bb}$.

10. The four-transistor random access memory cell as in claim 1, wherein the second transistor further comprises a bulk coupled to receive the first voltage.

11. The four-transistor random access memory cell as in claim 10, wherein the first voltage is $V_{dd}$ and the second voltage is a ground voltage.

12. The four-transistor random access memory cell as in claim 10, wherein the first voltage is $V_{dd}$ and the second voltage is $V_{bb}$.

13. The four-transistor random access memory cell as in claim 1, wherein the first and second conductivity types are respectively P and N type.

14. A random access memory cell comprising:
   a first transistor of a first conductivity type having a gate coupled to a word line, source coupled to a bit line, and a bulk coupled to receive a third voltage;
   a second transistor of a second conductivity type having a source coupled to receive a second voltage and a drain coupled to the drain of the first transistor;
   a diode having an anode coupled to the drain of the first transistor and a cathode coupled to receive a first voltage; and
   an inverter having an input terminal coupled to the drain of the first transistor and an output terminal coupled to a gate of the second transistor.

15. The random access memory cell as in claim 14, wherein the inverter comprises:
   a third transistor of the first conductivity type having a gate coupled to the drain of the first transistor and a source coupled to receive the first voltage; and
   a fourth transistor of the second conductivity type having a gate coupled to the drain of the first transistor, a source coupled to receive the second voltage and a drain coupled to the drain of the third transistor.

16. The random access memory cell as in claim 15, wherein the third transistor comprises the bulk coupled to receive the third voltage.

17. The random access memory cell as in claim 16, wherein the first voltage is $V_{dd}$, the second voltage is a ground voltage and the third voltage is $V_{PP}$ higher than $V_{dd}$.

18. The random access memory cell as in claim 16, wherein the first voltage is $V_{dd}$, the second voltage is $V_{bb}$ and the third voltage is $V_{PP}$ higher than $V_{dd}$.

19. The random access memory cell as in claim 15, wherein each of the first and third transistors comprises a bulk coupled to receive the first voltage.

20. The random access memory cell as in claim 19, wherein the first voltage is $V_{dd}$ and the second voltage is a ground voltage.

21. The random access memory cell as in claim 19, wherein the first voltage is $V_{dd}$ and the second voltage is $V_{bb}$.

22. The random access memory cell as in claim 15, wherein the diode is formed by a junction between the bulk and drain of the first transistor.

23. A memory device comprising:
   a plurality of memory cells wherein data is read from and written into each of the memory cells through bit lines by control signals on word lines, each of the memory cells comprising:
      a first transistor of a first conductivity type having a gate coupled to one of the word lines, a source coupled to one of the bit lines, and a bulk coupled to receive a third voltage;
      a second transistor of the first conductivity type having a gate coupled to a drain of the first transistor and a source coupled to receive a first voltage;
      a third transistor of a second conductivity type having a gate coupled to a drain of the second transistor, a source coupled to receive a second voltage and a drain coupled to the drain of the first transistor; and
      a fourth transistor of the second conductivity type having a gate coupled to the drain of the first transistor, a source coupled to receive the second voltage and a drain coupled to the drain of the second transistor.

24. The memory device as in claim 23, wherein the first voltage is $V_{dd}$, the second voltage is a ground voltage and the third voltage is $V_{PP}$ higher than $V_{dd}$.

25. The memory device as in claims 23, wherein the first voltage is $V_{dd}$, the second voltage is $V_{bb}$ and the third voltage is $V_{PP}$ higher than $V_{dd}$.

26. The memory device as in claim 23, wherein the second transistor further comprises a bulk coupled to receive the third voltage.

27. The memory device as in claim 26, wherein the first voltage is $V_{dd}$, the second voltage is a ground voltage and the third voltage is $V_{PP}$ higher than $V_{dd}$.

28. The memory device as in claim 26, wherein the first voltage is $V_{dd}$, the second voltage is $V_{bb}$ and the third voltage is $V_{PP}$ higher than $V_{dd}$.

29. The memory device as in claim 23, wherein the first transistor further comprises a bulk coupled to receive the first voltage.

30. The memory device as in claim 29, wherein the first voltage is $V_{dd}$, the second voltage is a ground voltage and the third voltage is $V_{PP}$ higher than $V_{dd}$.

31. The memory device as in claim 29, wherein the first voltage is $V_{dd}$, the second voltage is $V_{bb}$ and the third voltage is $V_{PP}$ higher than $V_{dd}$.

32. The memory device as in claim 23, wherein and the second transistor further comprises a bulk coupled to receive the first voltage.

33. The memory device as in claim 32, wherein the first voltage is $V_{dd}$, the second voltage is a ground voltage and the third voltage is $V_{PP}$ higher than $V_{dd}$.

34. The memory device as in claim 32, wherein the first voltage is $V_{dd}$, the second voltage is $V_{bb}$ and the third voltage is $V_{PP}$ higher than $V_{dd}$.

35. The memory device as in claim 23, wherein the first and second conductivity types are P and N type respectively.

36. A memory device comprising:
   a plurality of memory cells wherein data is read from and written into each of the memory cells through bit lines by control signals on word lines, each of the memory cells comprising:
      a first transistor of a first conductivity type having a gate coupled to a word line, a source coupled to a bit line, and a bulk coupled to receive a third voltage;
      a second transistor of a second conductivity type having a source coupled to receive a second voltage and a drain coupled to the drain of the first transistor;
      a diode having an anode coupled to the drain of the first transistor and a cathode coupled to receive a first voltage; and
      an inverter having an input terminal coupled to the drain of the first transistor and an output terminal coupled to a gate of the second transistor.

37. The memory device as in claim 36, wherein the inverter further comprises:
   a third transistor of the first conductivity type having a gate coupled to the drain of the first transistor and a source coupled to receive the first voltage; and
   a fourth transistor of the second conductivity type having a gate coupled to the drain of the first transistor, a source coupled to receive the second voltage and a drain coupled to the drain of the third transistor.

38. The memory device as in claim 37, wherein the third transistors comprises the bulk coupled to receive the third voltage.

39. The memory device as in claim 38, wherein the first voltage is Vdd, the second voltage is a ground voltage and the third voltage is VPP higher than Vdd.

40. The memory device as in claim 38, wherein the first voltage is Vdd, the second voltage is $V_{bb}$ and the third voltage is VPP higher than Vdd.

41. The memory device as in claim 37, wherein the first and third transistors each comprise a bulk coupled to receive the first voltage.

42. The memory device as in claim 41, wherein the first voltage is Vdd and the second voltage is a ground voltage.

43. The memory device as in claim 37, wherein the diode is formed by a junction between the bulk and drain of the first transistor.

44. T-SRAM cell in a SRAM array having pairs of a first and second bit line, and a first and second word line, comprising:

a first transistor of a first conductivity type having a gate coupled to one of the first word lines and a source coupled to one of the first bit lines;

a second transistor of the first conductivity type having a gate coupled to a drain of the first transistor and a source coupled to receive a first voltage;

a third transistor of a second conductivity type having a gate coupled to a drain of the second transistor, a source coupled to receive a second voltage and a drain coupled to the drain of the first transistor; and a fourth transistor of the second conductivity type having a gate coupled to one of the second word lines, a source coupled to one of the second bit lines and a drain coupled to the gate of the third transistor.

45. The 4T-SRAM cell as in claim 44, wherein bulks of the first and fourth transistor are respectively coupled to receive the first and second voltage.

46. The 4T-SRAM cell as in claim 44, wherein the first and second conductively types are respectively P and N type.

* * * * *